US012484434B2

(12) United States Patent
Kim et al.

(10) Patent No.: US 12,484,434 B2
(45) Date of Patent: Nov. 25, 2025

(54) DISPLAY DEVICE INCLUDING INNER AND OUTER ROLLERS

(71) Applicant: LG Display Co., Ltd., Seoul (KR)

(72) Inventors: ByungHee Kim, Anyang-si (KR); EunSup Yoon, Paju-si (KR); YongSuk Kim, Paju-si (KR); Laebong Jang, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 161 days.

(21) Appl. No.: 18/543,988

(22) Filed: Dec. 18, 2023

(65) Prior Publication Data

US 2024/0260444 A1 Aug. 1, 2024

(30) Foreign Application Priority Data

Jan. 31, 2023 (KR) ........................ 10-2023-0012986

(51) Int. Cl.

| | |
|---|---|
| ***H05K 1/02*** | (2006.01) |
| ***H10K 59/131*** | (2023.01) |
| ***H10K 77/10*** | (2023.01) |
| *H10K 102/00* | (2023.01) |

(52) U.S. Cl.

CPC ........... *H10K 77/111* (2023.02); *H05K 1/028* (2013.01); *H10K 59/131* (2023.02); *H05K 2201/10128* (2013.01); *H10K 2102/311* (2023.02); *H10K 2102/341* (2023.02)

(58) Field of Classification Search

CPC ...... G06F 1/1641; G06F 1/1652; G09F 9/301; G09F 9/335; G09F 9/35; H10K 59/131; H10K 77/111; H05K 1/028

See application file for complete search history.

(56) References Cited

U.S. PATENT DOCUMENTS

| | | | | |
|---|---|---|---|---|
| 6,849,085 | B2 * | 2/2005 | Marton | A61F 2/91 623/1.13 |
| 9,823,700 | B2 * | 11/2017 | Lee | G06F 1/1652 |
| 10,143,096 | B2 * | 11/2018 | Park | H05K 5/0217 |
| 2016/0187929 | A1 * | 6/2016 | Kim | G06F 1/1643 345/184 |
| 2019/0037716 | A1 * | 1/2019 | Kim | G06F 1/1652 |
| 2019/0064578 | A1 * | 2/2019 | Cho | H10K 77/111 |
| 2023/0217610 | A1 * | 7/2023 | Lee | G06F 1/1652 361/807 |

FOREIGN PATENT DOCUMENTS

| | | | | |
|---|---|---|---|---|
| CN | 111182090 A | * | 5/2020 | H04M 1/72439 |
| KR | 10-2022-0095492 A | | 7/2022 | |

* cited by examiner

*Primary Examiner* — Abhishek M Rathod

(74) *Attorney, Agent, or Firm* — Birch, Stewart, Kolasch & Birch, LLP

(57) ABSTRACT

A display device in one example includes a display unit, an outer roller configured to wind or unwind the display unit and including an inner circumferential surface having a spiral groove, an inner roller disposed in the outer roller and including an outer circumferential surface having a straight groove, a plurality of conductive balls disposed between the outer roller and the inner roller, and a roller connection unit interlinking rotations of the outer roller and the inner roller. The display unit can include a display panel and a back cover supporting a rear surface of the display panel. Further, the plurality of conductive balls can be configured to move along the spiral groove when the display unit is wound or unwound.

20 Claims, 15 Drawing Sheets

DISPLAY DEVICE INCLUDING INNER AND OUTER ROLLERS

CROSS-REFERENCE TO RELATED APPLICATIONS

This application claims priority Patent Application No. 10-2023-0012986 filed on Jan. 31, 2023, in the Korean Intellectual Property Office, the disclosure of which is incorporated herein by reference in its entirety.

BACKGROUND

Technical Field

The present disclosure relates to a display device, and more particularly, to a rollable display device which is capable of displaying images even in a rolled state (e.g., partially rolled).

Description of the Related Art

Among the display devices that are used as (or in) a monitor of a computer, a television, or a cellular phone, there are an organic light emitting display device (OLED) which is a self-emitting device, and a liquid crystal display device (LCD) which requires a separate light source.

An applicable range of the display device is diversified and covers the fields of personal digital assistants as well as monitors of computers and televisions. As such, a display device with a large display area and a reduced volume and weight is being studied.

Further, recently, a rollable display device is manufactured by forming a display element and a wiring line on a flexible substrate made of a flexible material, such as plastic, so as to be capable of displaying images even in a rolled state. Such rollable display device is getting attention as a next generation display device.

However, some rollable display device may not be capable of displaying images well in a rolled state, and further, can lack smooth operation (e.g., rolling and unrolling) of its rollable display device.

SUMMARY OF THE DISCLOSURE

An object to be achieved by one or more embodiments of the present disclosure is to provide an improved display device, which can address the limitations associated with the related art.

Another object to be achieved by one or more embodiments of the present disclosure is to provide a display device which improves an electromagnetic interference noise (EMI) which is generated by a printed circuit board inserted in a roller unit.

Another object to be achieved by one or more embodiments of the present disclosure is to provide a display device which controls a resonance length of a roller unit which is a fixed tool.

Objects of the present disclosure are not limited to the above-mentioned objects, and other objects, which are not mentioned above, can be clearly understood by those skilled in the art from the following descriptions.

In order to achieve the above-described objects and other objects, according to an aspect of the present disclosure, a display device includes a display unit which includes a display panel and a back cover supporting a rear surface of the display panel, an outer roller which is configured to wind or unwind the display unit and has a spiral groove disposed on an inner circumferential surface, an inner roller which is accommodated in the outer roller and has a straight groove disposed on an outer circumferential surface, a plurality of conductive balls which is disposed between the outer roller and the inner roller and configured to move along the spiral groove when the display unit is wound or unwound, and a roller connection unit which interlinks rotations of the outer roller and the inner roller.

Other detailed matters of the exemplary embodiments are included in the detailed description and the drawings.

According to an aspect of the present disclosure, a resonance frequency of a roller unit which accommodates a printed circuit board is avoided to minimize the generation of the electromagnetic interference noise.

According to an aspect of the present disclosure, a plurality of conductive balls is disposed between an inner roller and an outer roller to control a resonance length of the roller unit.

The effects according to the embodiments of the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
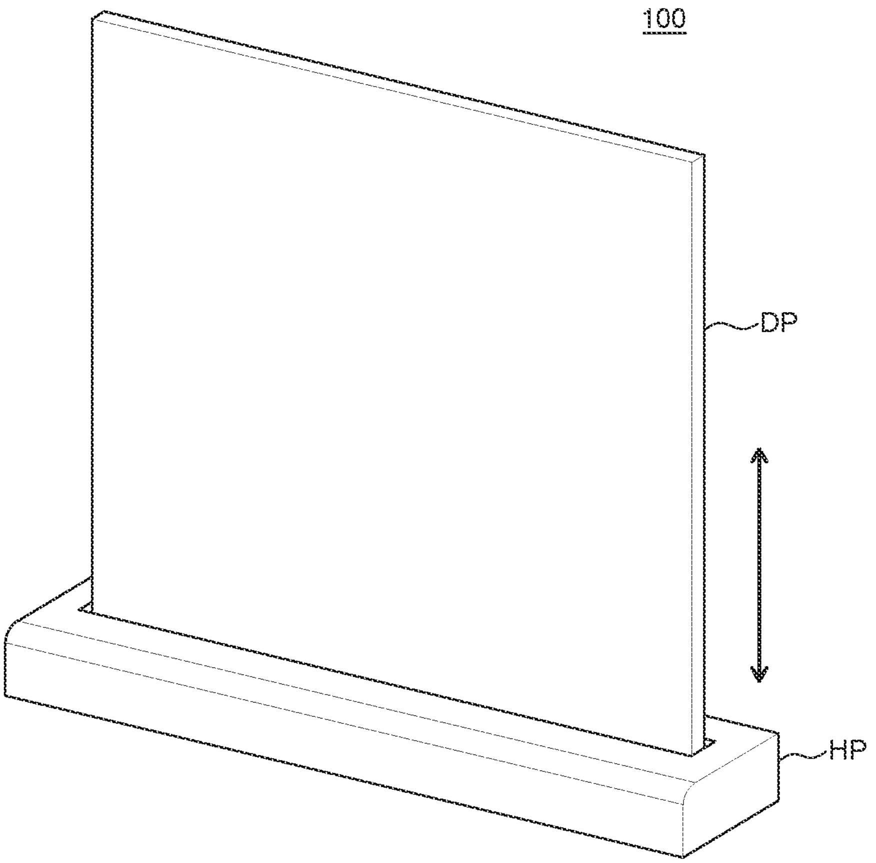
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as ' including,' 'having,' 'comprising,' 'consist of,' etc. used herein are generally intended to allow other components to be added unless the terms are used with the term 'only'. Any references to singular can include plural unless expressly stated otherwise.

Components are interpreted to include an ordinary error range even if not expressly stated.

When the position relation between two parts is described using the terms such as 'on,' 'over,' 'above,' 'below,' 'under,' 'next,' etc., one or more parts can be positioned between the two parts unless the terms are used with the term 'immediately' or 'directly'.

When an element or layer is disposed "on" or "over" another element or layer, one or more additional layers or elements can be interposed directly on the other element or therebetween.

Although the terms "first", "second", and the like are used for describing various components, these components are not confined by these terms, and may not define order or sequence. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated. Further, the term "exemplary" has the same or similar meaning as and is interchangeably used with the term "example."

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings. All the components of each display device according to all embodiments of the present disclosure are operatively coupled and configured.

<Display Device-Rollable Display Device>

A rollable display device can refer to as a display device which is capable of displaying images even though the display device is rolled (e.g., rolled onto itself). The rollable display device can have a high flexibility as compared with a general display device of the related art. Depending on whether to use a rollable display device, a shape of the rollable display device can freely vary. Specifically, when the rollable display device is not used, the rollable display device is rolled to be stored with a reduced volume. In contrast, when the rollable display device is used, the rolled rollable display device is unrolled to be used.

Figure 1B:
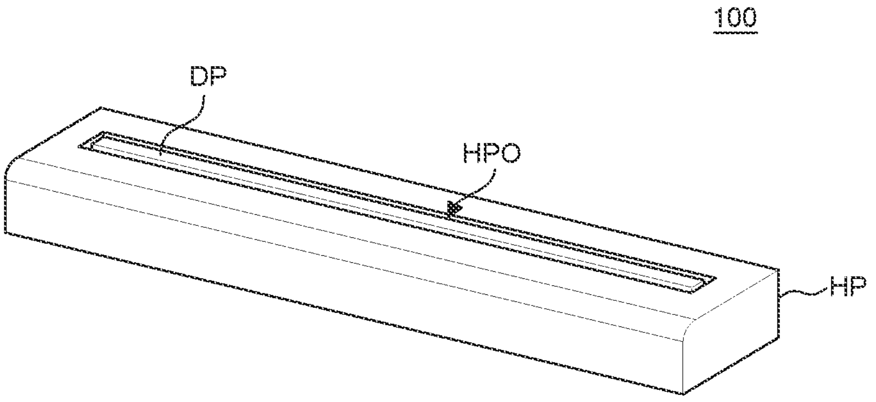

FIGS. 1A and 1B are perspective views of a display device according to an exemplary embodiment of the present disclosure.

Referring to FIGS. 1A and 1B, a display device 100 according to the exemplary embodiment of the present disclosure includes a display unit DP and a housing unit HP.

The display unit DP is a configuration for displaying images to a user and for example, in the display unit DP, a display element and a circuit, a wiring line, and a component for driving the display element can be disposed. In this case, since the display device 100 according to the exemplary embodiment of the present disclosure is a rollable display device 100, the display unit DP can be configured to be wound or unwound. For example, the display unit DP can be formed of a display panel 120 and a first cover 110*a* (e.g., see FIGS. 4A and 4B) each having a flexibility to be wound or unwound. The display unit DP will be described below in more detail with reference to FIGS. 4A and 4B.

The housing unit HP is a case (e.g., housing) in which the display unit DP is accommodated. The housing unit HP has an opening HPO to allow the display unit DP to move to inside and outside of the housing unit HP.

In the meantime, the display unit DP of the display device 100 can be switched from a fully unwound state as illustrated in FIG. 1A to a fully wound state as illustrated in FIG. 1B or from a fully wound state to a fully unwound state.

In order to switch the display unit DP to a fully unwound state or a fully wound state, a driving unit MP (160, 170) which winds or unwinds the display unit DP is disposed.

<Driving Unit>

Figure 2:
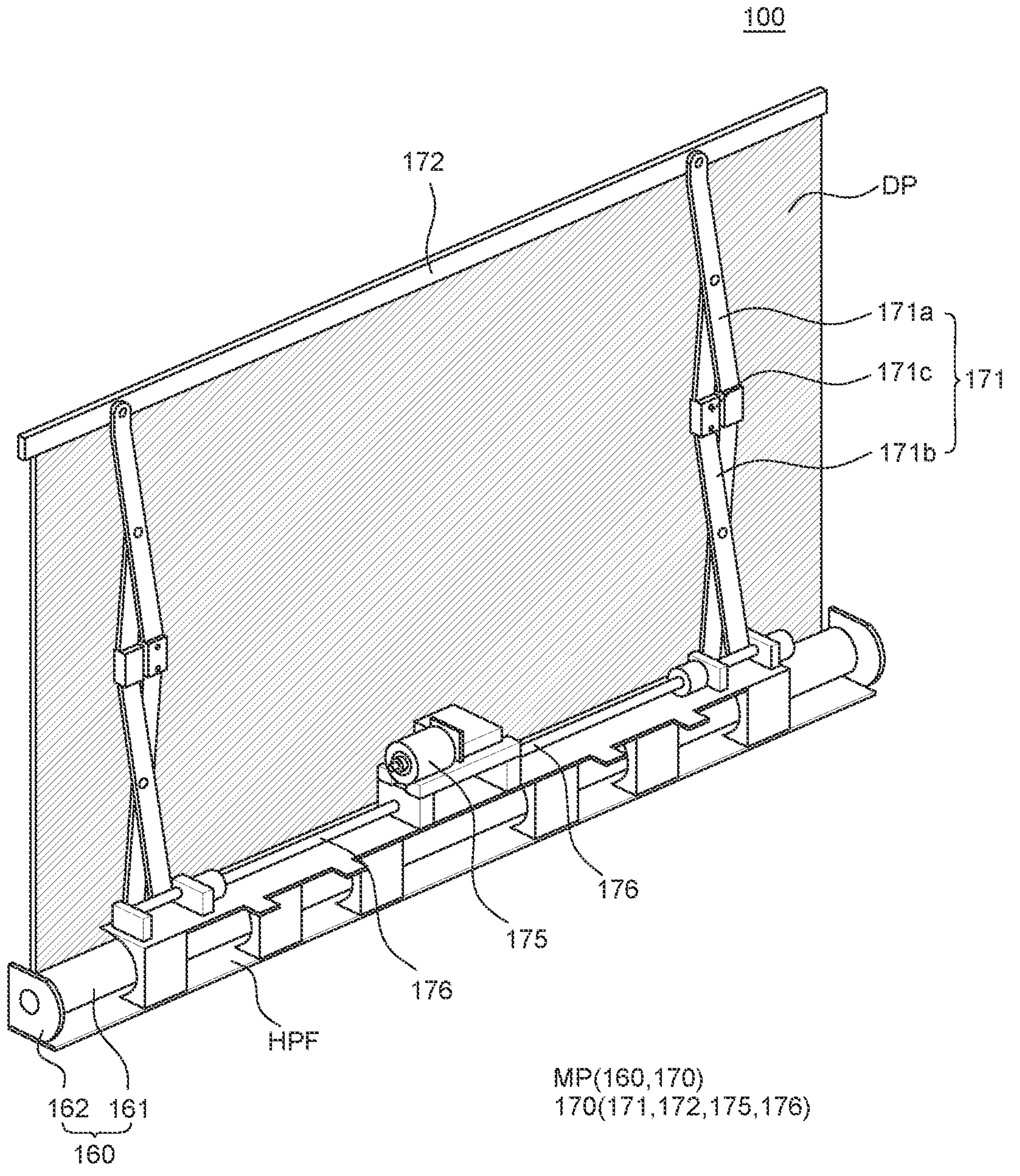
FIG. 2 is a perspective view of a display device according to an exemplary embodiment of the present disclosure.
Figure 3:
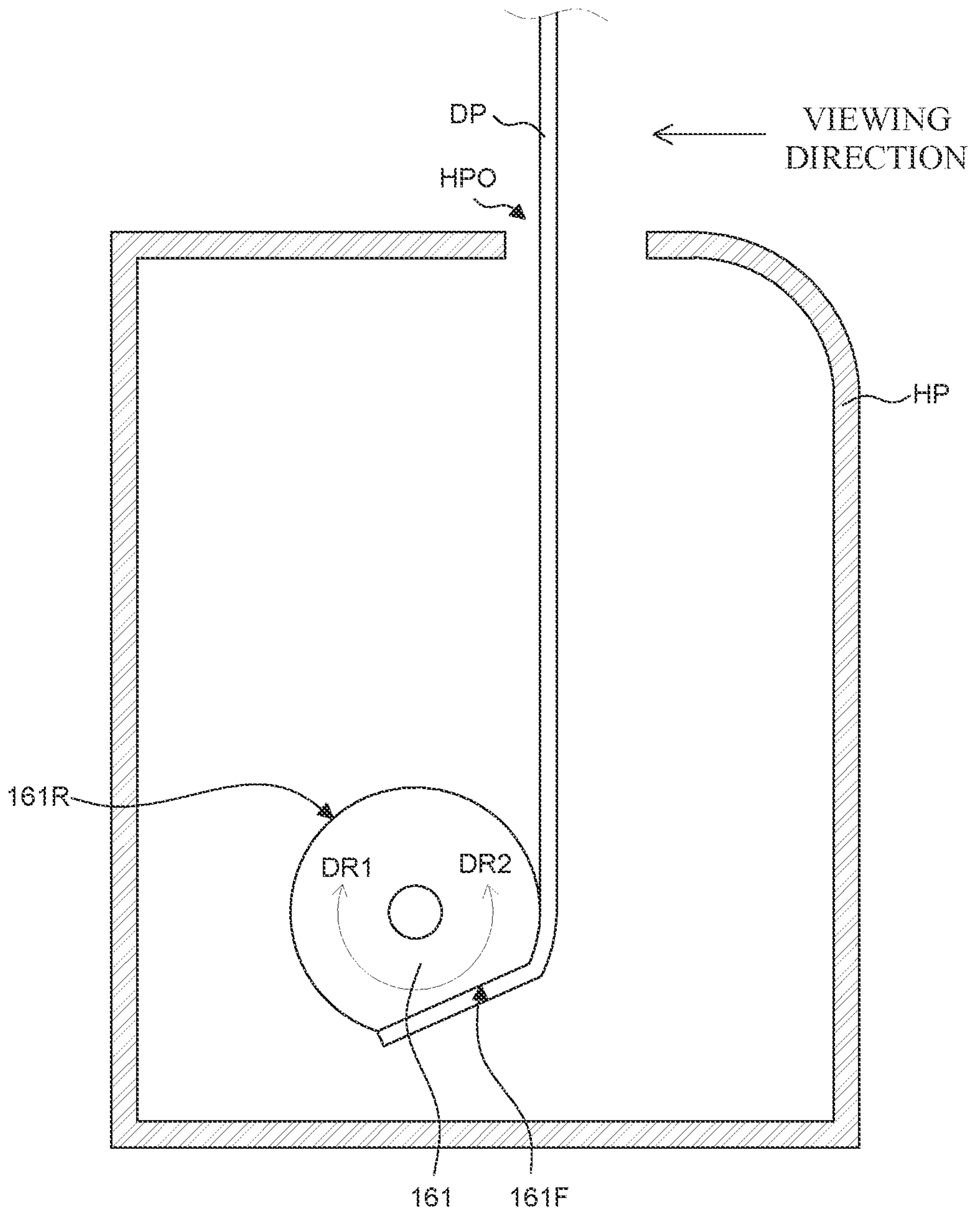
FIG. 3 is a schematic cross-sectional view of a display device according to an exemplary embodiment of the present disclosure.

FIG. 2 is a perspective view of a display device according to an exemplary embodiment of the present disclosure. FIG. 3 is a schematic cross-sectional view of a display device according to an exemplary embodiment of the present disclosure. Particularly, FIG. 3 is a schematic cross-sectional view for explaining a roller 161 and a display unit DP of a display device 100 according to an exemplary embodiment of the present disclosure. For the convenience of description, in FIG. 3, a housing unit HP, a roller 161, and a display unit DP are illustrated.

First, referring to FIG. 2, the driving unit MP includes a roller unit 160 and a lifting unit 170.

The roller unit 160 rotates in a clockwise direction to wind the display unit DP fixed to the roller unit 160 or a counterclockwise direction to unwind the display unit DP fixed to the roller unit 160. The roller unit 160 includes an outer roller 161 and a roller support unit 162.

The outer roller 161 is a member around which the display unit DP is wound. The outer roller 161 can be, for example, formed to have a cylindrical shape. A lower edge (e.g., lower surface) of the display unit DP can be fixed to the outer roller 161. When the outer roller 161 rotates, the display unit DP which is fixed to the outer roller 161 through the lower edge can be wound around the outer roller 161. In contrast, when the outer roller 161 rotates in an opposite direction, the display unit DP which is wound around the outer roller 161 can be unwound from the outer roller 161.

Referring to FIG. 3, the outer roller 161 can be formed to have a cylindrical shape in which at least a part of an outer circumferential surface is flat, and the remaining part of the outer circumferential surface is curved. Even though the outer roller 161 can have entirely a cylindrical shape, a part thereof can be formed of a flat surface. That is, a part of the outer circumferential surface of the outer roller 161 is formed to be flat and the remaining part of the outer circumferential surface can be formed as a curved surface. For example, the outer roller 161 can be configured by or includes a round portion 161R and a flat portion 161F and the flat portion 161F of the outer roller 161 can be a portion in which the plurality of flexible films and the printed circuit board of the display unit DP are seated (see FIG. 3). However, the outer roller 161 can have a completely (e.g. entirely) cylindrical shape, so as to be provided with a uniform shape, or also an arbitrary shape which can wind the display unit DP, but is not limited thereto.

Referring to FIG. 2 again, the roller support unit 162 supports the outer roller 161 at both sides of the outer roller 161. Specifically, the roller support unit 162 is disposed on a bottom surface HPF of the housing unit HP and can include a flange. Side surfaces (e.g., internal or inner side surfaces) of the roller support unit 162 are coupled to both ends (e.g., outer ends) of the outer roller 161. By doing this, the roller support unit 162 can support the outer roller 161 to be spaced apart from the bottom surface HPF of the housing unit HP. In this case, the outer roller 161 can be rotatably coupled to the roller support unit 162.

The lifting unit 170 (171, 172, 175, 176) moves the display unit DP in a vertical direction in accordance with the driving of the roller unit 160. The vertical direction being perpendicular to an extension direction of the outer roller 161, and the extension direction of the outer roller 161 intersects the roller support unit 162. The lifting unit 170 includes a link unit 171, a head bar 172, a motor 175, and a rotary unit 176.

The link unit 171 of the lifting unit 170 includes a plurality of links 171*a* and 171*b* and a hinge unit 171*c* which connects the plurality of links 171*a* and 171*b* to each other. Specifically, the plurality of links 171*a* and 171*b* include a first link 171*a* and a second link 171*b* and the first link 171*a* and the second link 171*b* cross each other in the form of scissors (e.g., are pivoted to slide against one another) to be rotatably fastened by means of the hinge unit 171*c*. The link unit 171 can be configured by a plurality of links 171*a* and 171*b* which intersects each other, but the number of links is not limited so that the link unit can also be configured by a single link. When the link unit 171 moves in the vertical direction, each of the plurality of links 171*a* and 171*b* can rotate in a direction to be far away from each other (e.g., a direction so that the plurality of links 171*a* and 171*b* become displaced away from one another) or close to each other (e.g., a direction so that the plurality of links 171*a* and 171*b* become displaced toward one another). The link unit 171 can be configured by a plurality of links 171*a* and 171*b* which intersects each other, but it is not limited thereto, and the link unit can also be configured by a single link which does not intersect.

The head bar 172 of the lifting unit 170 is fixed to an uppermost end of the display unit DP. The head bar 172 is coupled to the link unit 171 to move the display unit DP in the vertical direction in accordance with the rotation of the plurality of links 171*a* and 171*b* of the link unit 171. That is, the display unit DP can move in a vertical direction by the head bar 172 and the link unit 171.

The head bar 172 covers only a part of a surface which is adjacent to an uppermost edge of the display unit DP so as not to block an image displayed on the front surface of the display unit DP. The display unit DP and the head bar 172 can be fixed by a screw, but are not limited thereto. That is, the head bar 172 can be fixed to the display unit DP by a fastener, such as a screw, but can also (or in addition to) be fixed by an adhesive, or by any known means, such as a press-fit.

The motor 175 is connected to a power generating unit, such as a separate external power source or a built-in battery, to be supplied with the power. The motor 175 generates a torque to provide a driving force to the rotary unit 176.

The rotary unit 176 is connected to the motor 175 to convert a rotational motion from the motor 175 into a linear reciprocating motion. That is, the rotational motion of the motor 175 can be converted into the linear reciprocating motion of a structure fixed to the rotary unit 176. For example, the rotary unit 176 can be implemented by a ball screw (e.g., mechanical linear actuator that converts rotational motion into linear motion, as known in the art) including a shaft and a nut which is fastened with the shaft, but is not limited thereto.

The motor 175 and the rotary unit 176 interwork with the link unit 171 to lift and lower the display unit DP. The link unit 171 is formed with a link structure to receive the driving force from the motor 175 and the rotary unit 176 to repeatedly perform the folding or unfolding operation.

Specifically, when the display unit DP is wound, the motor 175 is driven so that the structure of the rotary unit 176 can perform the linear motion. That is, a part of the rotary unit 176 to which one end (e.g., a first end) of the second link 171*b* is coupled can perform the linear motion. Therefore, one end of the second link 171*b* can move towards the motor 175 so that the plurality of links 171*a* and 171*b* is folded and the height of the link unit 171 is lowered. Further, while the plurality of links 171*a* and 171*b* are folded, the head bar 172 coupled to the first link 171*a* is also lowered and one end of the display unit DP coupled to the head bar 172 is also lowered.

When the display unit DP is unwound, the motor 175 is driven so that the structure of the rotary unit 176 can perform linear motion. That is, a part of the rotary unit 176 to which one end of the second link 171*b* is coupled can perform the linear motion. Therefore, one end of the second link 171*b* can move to be further away from the motor 175, to cause the plurality of links 171*a* and 171*b* to be unfolded so that the height of the link unit 171 can be increased. Further, while the plurality of links 171*a* and 171*b* is unfolded, the head bar 172 coupled to the first link 171*a* is also lifted and the display unit DP coupled to the head bar 172 is also lifted.

Accordingly, when the display unit DP is fully wound around the outer roller 161, the link unit 171 of the lifting unit 170 maintains a folded state. That is, when the display unit DP is fully wound around the outer roller 161, the lifting unit 170 can have a smallest height. In contrast, when the display unit DP is fully unwound, the link unit 171 of the lifting unit 170 maintains an unfolded state. That is, when the display unit DP is fully unwound, the lifting unit 170 can have a largest height.

In the meantime, when the display unit DP is wound, the outer roller 161 can rotate and the display unit DP can be wound around the outer roller 161. Referring to FIG. 3, a lower edge of the display unit DP is coupled to the outer roller 161. When the outer roller 161 rotates in a first direction (e.g., first rotational direction) DR1, that is, a clockwise direction, the display unit DP can be wound while a rear surface of the display unit DP is in close contact (e.g., direction contact) with a surface of the outer roller 161.

When the display unit DP is unwound, the outer roller 161 can rotate and the display unit DP can be unwound from the outer roller 161. For example, referring to FIG. 3, when the outer roller 161 rotates in a second direction (e.g., second rotational direction) DR2, that is, in a counterclockwise direction, the display unit DP which is wound around the outer roller 161 is unwound from the outer roller 161 to be disposed at the outside of the housing unit HP. The first direction is opposite to the second direction.

In some exemplary embodiments, a driving unit MP having another structure other than the above-described driving unit MP can also be applied to the display device 100. That is, as long as the display unit DP is wound and unwound, the above-described configuration of the roller unit 160 and the lifting unit 170 can also be modified, some configurations can be omitted, or another configuration can also be added. The driving unit MP can comprise an electric motor or the like.

<Display Unit>

Figure 4A:
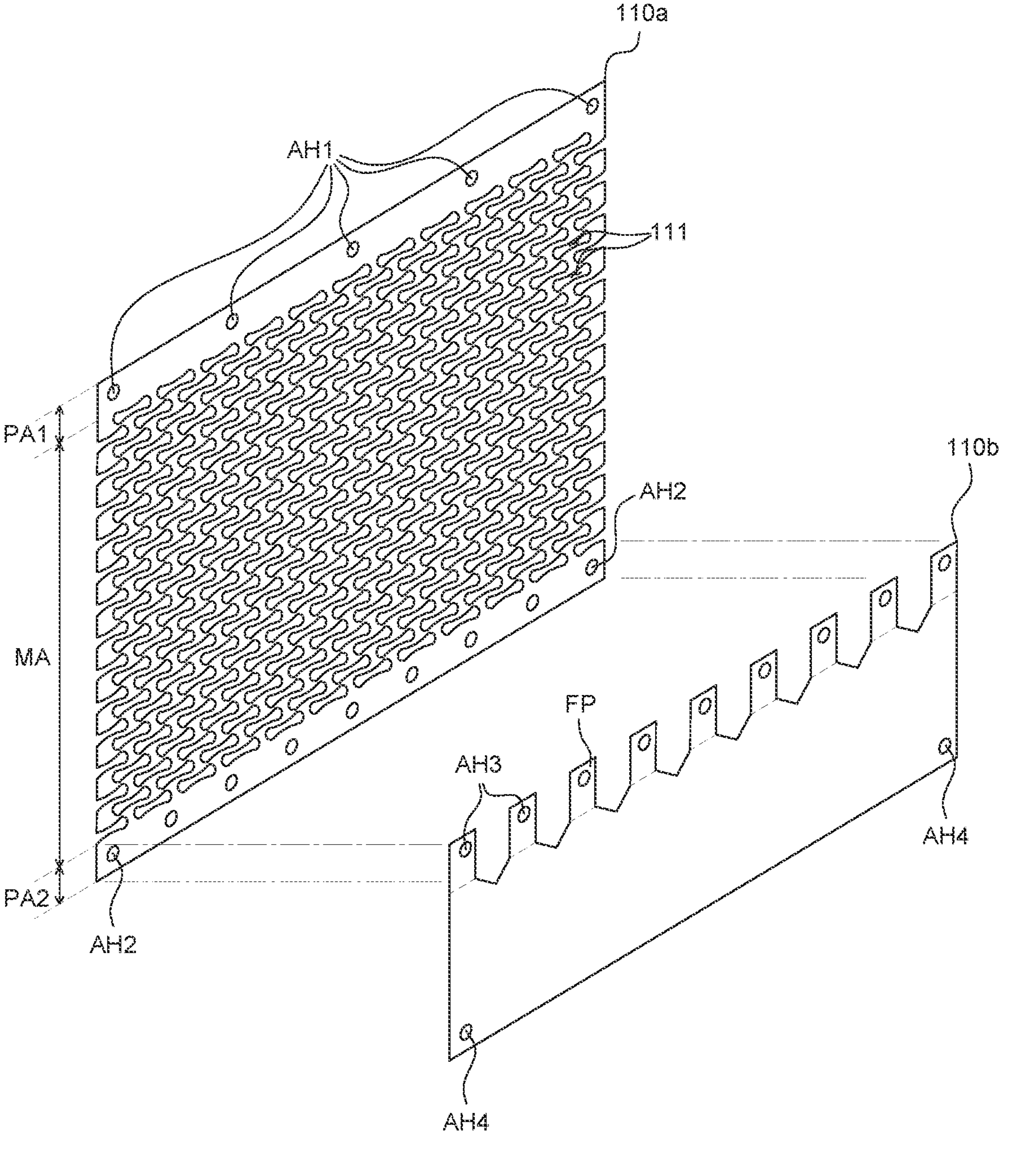
FIG. 4A is an exploded perspective view for explaining a first cover and a second cover of a display device according to an exemplary embodiment of the present disclosure.
Figure 4B:
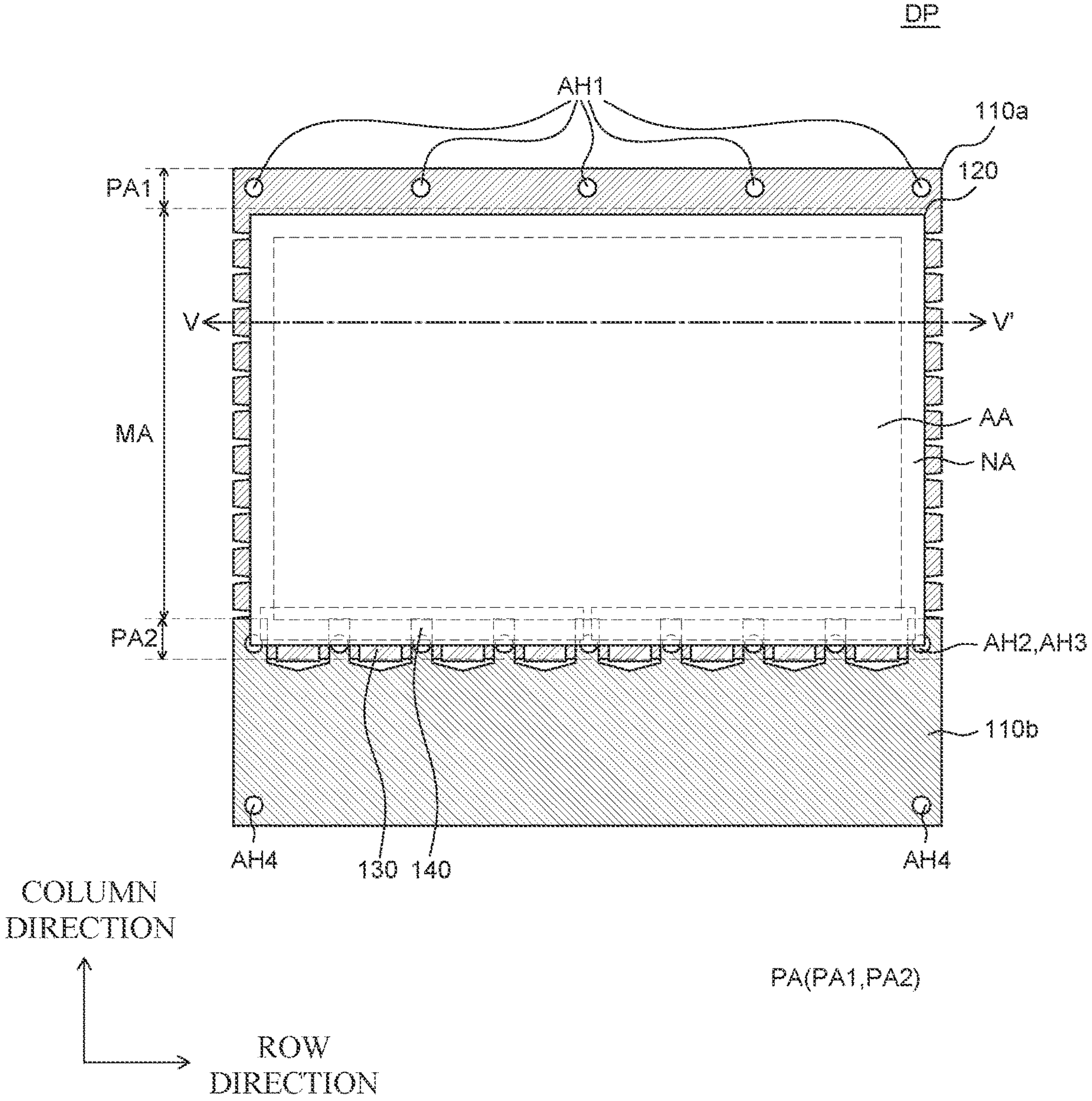
FIG. 4B is a plan view of a display unit of a display device according to an exemplary embodiment of the present disclosure.
Figure 5:
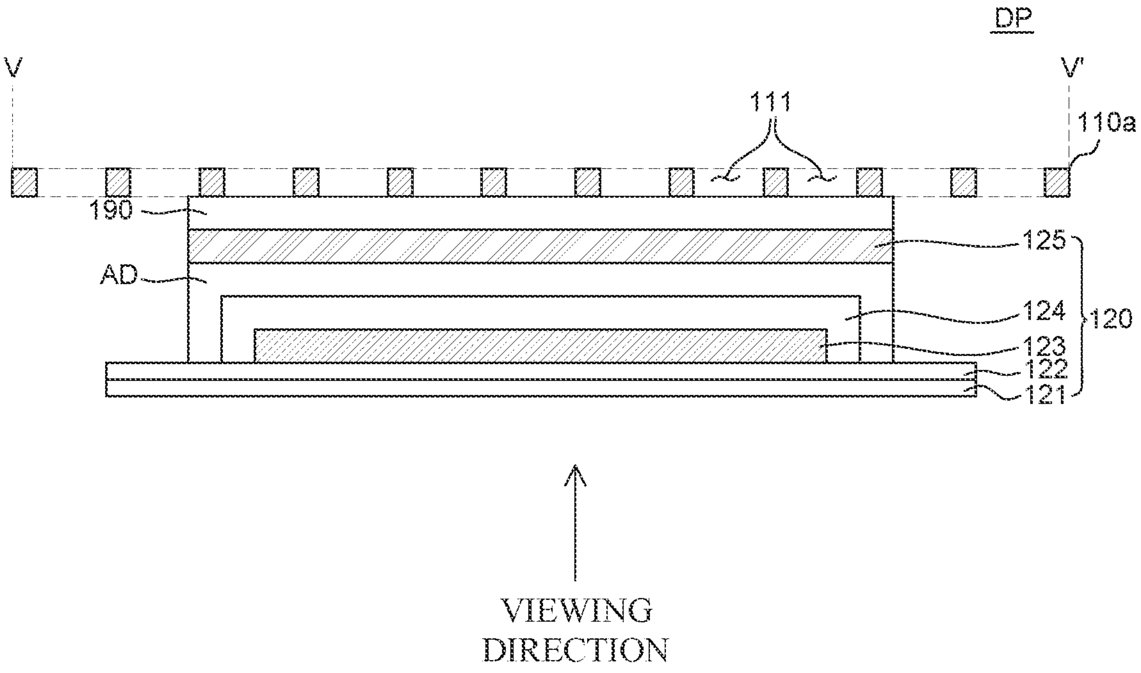
FIG. 5 is a cross-sectional view taken along the line V-V' of FIG. 4B according to an example of the present disclosure.

FIG. 4A is an exploded perspective view for explaining a first cover and a second cover of a display device according to an exemplary embodiment of the present disclosure. FIG. 4B is a plan view of a display unit of a display device according to an exemplary embodiment of the present disclosure. FIG. 5 is a cross-sectional view taken along the line V-V' of FIG. 4B according to an example of the present disclosure.

Referring to FIGS. 4A, 4B, and 5, the display unit DP includes a first cover 110*a*, a display panel 120, a plurality of flexible films 130, a first printed circuit board 140, a second cover 110*b*, and an adhesive unit 190. However, it is not limited thereto and the display unit DP can also be defined to include only a display panel 120, a plurality of flexible films 130, and a first printed circuit board 140.

Referring to FIGS. 4A and 4B, the first cover 110*a* is disposed on a rear surface of the display panel 120 and can support the display panel 120. The first cover 110*a* is disposed on the rear surface of the display panel 120 so that the first cover 110*a* can also be referred to as a back cover. A size of the first cover 110*a* can be larger than a size of the display panel 120. The first cover 110*a* can protect other configurations of the display unit DP from the outside.

Even though the first cover 110*a* is formed of a material having a rigidity, at least a part of the first cover 110*a* can have a flexibility to be wound or unwound together with the display panel 120. For example, the first cover 110*a* can be formed of a metal material, such as steel use stainless (SUS) or Invar (e.g., a nickel-iron alloy FeNi36) or plastic. However, if the material of the first cover 110*a* satisfies physical conditions, such as a thermal strain, a radius of curvature, and a rigidity, the material can be diversely changed depending on the design, and is not limited thereto.

The first cover 110*a* can be fastened with the head bar 172 and the second cover 110*b*.

The first cover 110*a* includes a plurality of support areas PA (PA1, PA2) and a malleable area MA. The plurality of support areas PA are areas where a plurality of openings 111 is not disposed and the malleable area MA is an area where the plurality of openings 111 are disposed. Specifically, the first cover 110*a* includes a first support area PA1, a malleable area MA, and a second support area PA2 and the first support area PA1, the malleable area MA, and the second support area PA2 are sequentially disposed from an uppermost end of the first cover 110*a* towards a lowermost end of the first cover 110*a*. In this case, since the first cover 110*a* is wound or unwound in a column direction, the plurality of support areas PA and the malleable area MA can be disposed along the column direction.

The first support area PA1 of the first cover 110*a* is an uppermost area of the first cover 110*a* and is fastened with the (e.g., to the) head bar 172. The first support area PA1 can form first fastening holes AH1 to be fastened with the head bar 172. For example, screws (e.g., fasteners) which pass through the head bar 172 and the first fastening holes AH1 are disposed so that the head bar 172 can be fastened with the first support area PA1. As the first support area PA1 is fastened with the head bar 172, when the link unit 171 which is fastened with the head bar 172 is lifted or lowered, the first cover 110*a* can also be lifted and lowered together, and the display panel 120 which is attached to the first cover 110*a* can also be lifted and lowered. Even though five first fastening holes AH1 are illustrated in FIGS. 4A and 4B, the number of first fastening holes AH1 is not limited thereto. Further, even though it has been described that the first cover 110*a* is fastened with the head bar 172 using the first fastening holes AH1, it is not limited thereto and the first cover 110*a* and the head bar 172 can also be fastened with each other without using a separate fastening hole.

The malleable area MA of the first cover 110*a* is an area extending from the first support area PA1 to a lower side of the first cover 110*a*. The malleable area MA is an area in which a plurality of openings 111 is disposed and the display panel 120 is attached. Specifically, the malleable area MA is an area which is wound around or unwound from the outer roller 161 together with the display panel 120. The malleable area MA can overlap at least the display panel 120 among other configurations of the display unit DP.

The second support area PA2 of the first cover 110*a* is an area which extends from the malleable area MA and is a lowermost area of the first cover 110*a*. One end of the display panel 120 is disposed in the second support area PA2. For example, a pad area, which is a non-active area at one end of the display panel 120, can be disposed in the second support area PA2.

Referring to FIG. 4A, second fastening holes AH2 are disposed in the second support area PA2. Even though nine second fastening holes AH2 are illustrated in FIG. 4A, the number of second fastening holes AH2 is illustrative and is not limited thereto.

In the meantime, in the first support area PA1 and the second support area PA2, the plurality of openings 111 as formed in the malleable area MA is not formed. Specifically, in the first support area PA1 and the second support area PA2, only the first fastening holes AH1 and the second fastening holes AH2 are formed, but the plurality of openings 111 as formed in the malleable area MA is not formed. Further, the first fastening holes AH1 and the second fastening holes AH2 have different shapes from that of the plurality of openings 111. That is, the plurality of openings 111 can have an oblong shape with two circular ends and a center section between the two circular ends that is narrower than the two circular ends.

The first support area PA1 is an area fixed to the head bar 172 and the second support area PA2 is an area where one end of the display panel 120, the plurality of flexible films 130, and the first printed circuit board 140 are supported and can have a rigidity larger than that of the malleable area MA. Further, as the first support area PA1 and the second support area PA2 have the rigidity, the first support area PA1 and the second support area PA2 can be firmly fixed to the head bar 172 and the second cover 110*b*. The second support area PA2 maintains the pad area and the first printed circuit board 140 at one end of the display panel 120 to be flat to protect the pad area and the first printed circuit board 140 of the display panel 120. Therefore, the display unit DP is fixed to the head bar 172 of the driving unit MP to move to the inside or the outside of the housing unit HP in accordance with the operation of the driving unit MP and can protect the pad area and the first printed circuit board 140 at one end of the display panel 120.

In the meantime, in FIG. 4A, even though it is illustrated that the plurality of support areas PA and the malleable area MA of the first cover 110*a* are sequentially disposed along the column direction, when the first cover 110*a* is wound in the row direction, the plurality of support areas PA and the malleable area MA can be disposed along a row direction.

When the display unit DP is wound or unwound, the plurality of openings 111 disposed in the malleable area MA of the first cover 110*a* can be deformed by a stress (e.g., elastic or non-plastic stress) which is applied to the display unit DP. Specifically, when the display unit DP is wound or unwound, the malleable area MA of the first cover 110*a* can be deformed as the plurality of openings 111 contracts or expands. Further, as the plurality of openings 111 contracts or expands, a slip phenomenon of the display panel 120 disposed on the malleable area MA of the first cover 110*a* is minimized so that the stress which is applied to the display panel 120 can be minimized.

When the display panel 120 and the first cover 110*a* are wound, a difference between a length of the display panel 120 and a length of the first cover 110*a* which are wound around the outer roller 161 can be caused due to the difference of radii of curvature of the display panel 120 and the first cover 110*a*. For example, when the first cover 110*a* and the display panel 120 are wound around the outer roller 161, a length of the first cover 110*a* required for wound around the outer roller 161 once can be different from a length of the display panel 120 required for being wound around the outer roller 161 once. That is, since the display panel 120 is disposed to the outside than the first cover 110*a* based on the outer roller 161, a length of the display panel 120 required to be wound around the outer roller 161 once can be larger than a length of the first cover 110*a* required to be wound around the outer roller 161 once. As described above, the winding lengths of the first cover 110*a* and the display panel 120 are different from each other due to the difference of radii of curvature at the time of winding the display unit DP and the display panel 120 attached to the first cover 110*a* can slide to move from its original position. In this case, a phenomenon that the display panel 120 slides from the first cover 110*a* due to the stress and the difference of radii of curvature caused by the winding can be defined as a slip phenomenon. When the slip phenomenon is excessively increased, the display panel 120 can be detached from the first cover 110*a* or failures such as cracks can be caused.

In this case, in the display device 100 according to an exemplary embodiment of the present disclosure, even though the display unit DP is wound or unwound and a stress is applied to the display unit DP, the plurality of openings 111 of the first cover 110*a* is flexibly deformed to relieve stress applied to the first cover 110*a* and the display panel 120. For example, when the first cover 110*a* and the display panel 120 are wound around the outer roller 161 along the column direction, a stress which deforms the first cover 110*a* and the display panel 120 in a vertical direction can be applied. In this case, the plurality of openings 111 of the first cover 110*a* can extend in a vertical direction of the first cover 110*a* and the length of the first cover 110*a* can also be flexibly deformed. Therefore, the difference in lengths of the first cover 110*a* and the display panel 120 caused by the difference in radii of curvature during the process of winding the first cover 110*a* and the display panel 120 can be compensated by the plurality of openings 111 of the first cover 110*a*. Further, the plurality of openings 111 are deformed during the process of winding the first cover 110*a* and the display panel 120 so that a stress which is applied to the display panel 120 from the first cover 110*a* can also be relieved.

The second cover 110*b* is fastened with the first cover 110*a* and the outer roller 161 to connect the first cover 110*a* and the outer roller 161 via a plurality of fasteners extending through the plurality of second fastening holes AH2. The second cover 110*b* connects the first cover 110*a* and the outer roller 161 by the above-described method and can finally connect the display panel 120 disposed in the first cover 110*a* to the outer roller 161. However, it is not limited thereto so that as long as the second cover 110*b* is connected to the first cover 110*a* and the outer roller 161, a shape or a connection method of the second cover 110*b* can vary in various ways depending on the design, but is not limited thereto.

One end of the second cover 110*b*, which is an uppermost area of the second cover 110*b*, can overlap one end of the first cover 110*a*. For example, one end of the second cover 110*b* can overlap the second support area PA2. One end of the second cover 110*b* overlaps a part of the first cover 110*a* to be connected or one end of the second cover 110*b* is connected to the part of the first cover 110*a* using a connection member each other, but is not limited thereto.

The second cover 110*b* can include a plurality of fastening units FP (e.g., flanges) overlapping the first cover 110*a*. The plurality of fastening units FP are disposed at one end of the second cover 110*b*. Further, in the plurality of fastening units FP, a plurality of third fastening holes AH3 to be fastened with the first cover 110*a* can be disposed. That is, each fastening unit FP can include a third fastening hole AH3. The plurality of fastening units FP in which the plurality of third fastening holes AH3 are disposed is spaced apart from each other and a space which allows the plurality of flexible films 130 to be bent can be ensured between the plurality of fastening units FP. Even though nine third fastening holes AH3 are illustrated in FIG. 4A, the number of third fastening holes AH3 is illustrative and is not limited thereto.

In FIG. 4A, it is described that the second fastening holes AH2 and the third fastening holes AH3 to be fastened with the first cover 110*a* and the second cover 110*b* are disposed in the second support area PA2 of the first cover 110*a* and one end of the second cover 110*b*, respective. However, the first cover 110*a* and the second cover 110*b* can also be fixed to each other without using a separate fastening hole.

In the meantime, when the second support area PA2 and the plurality of fastening units FP are wound around the outer roller 161, an outer circumferential surface of the outer roller 161 which overlaps the second support area PA2 and the plurality of fastening units FP can be a flat portion 161F. Therefore, the second support area PA2 can always maintain the flat state regardless of the wound or unwound state to the outer roller 161 and the pad area at one end of the display panel 120 and the first printed circuit board 140 disposed in the second support area PA2 can also maintain the flat state.

An area from one end (e.g., a first end) to the other end (e.g., a second end) of the second cover 110*b* is an area which extends to dispose the active area AA of the display panel 120 at the outside of the housing unit HP. For example, when the first cover 110*a* and the display panel 120 are in fully unwound states, an area from the other end of the second cover 110*b* which is fixed to the outer roller 161 to one end of the second cover 110*b* in which the plurality of flexible films 130 and the first printed circuit board 140 are disposed can be disposed in the housing unit HP. The malleable area MA and the first support area PA1 in which the active area AA of the display panel 120 is disposed can be disposed at the outside of the housing unit HP. That is, an area from the other end of the second cover 110*b* fixed to the outer roller 161 to at least a part of an end of the second cover 110*b* and the second support area PA2 can be disposed in the housing unit HP.

The other end of the second cover 110*b* is a lowermost area of the second cover 110*b* which is fastened with the outer roller 161. A fourth fastening hole AH4 (e.g., one or more fourth fastening holes AH4) can be formed at the other end of the second cover 110*b* to be fastened with the outer roller 161. For example, a fastening member which passes through the outer roller 161 and the fourth fastening holes AH4 is disposed to fasten the outer roller 161 and the other end of the second cover 110*b* with each other. As the other end of the second cover 110*b* is fastened with the outer roller 161, the display panel 120, the first cover 110*a*, and the second cover 110*b* can be wound around or unwound from the outer roller 161. Even though two fourth fastening holes AH4 are illustrated in FIG. 4A, the number of fourth fastening holes AH4 is not limited thereto.

In the meantime, in the second cover 110*b*, the plurality of openings 111 as formed in the malleable area MA of the first cover 110*a* is not formed. Specifically, the third fastening holes AH3 and the fourth fastening holes AH4 are formed at each one end and the other end of the second cover 110*b*, but the plurality of openings 111 as formed in the malleable area MA of the first cover 110*a* is not formed. Further, the third fastening hole AH3 and the fourth fastening hole AH4 have different shapes from the plurality of openings 111.

The second cover 110*b* can be formed of a flexible material to be wound around or unwound from the roller. For example, the second cover 110*b* can be formed of a plastic material such as polyethylene terephthalate (PET). However, if the material of the second cover 110*b* satisfies physical conditions, such as a thermal strain, a radius of curvature, and a rigidity, the material can be diversely changed depending on the design, and is not limited thereto.

Referring to FIGS. 4B and 5, the display panel 120 is disposed on one surface of the first cover 110*a*. The display panel 120 is disposed in the malleable area MA, on one surface of the first cover 110*a*. The display panel 120 is a panel for displaying images to a user. The display panel 120 can include a display element which displays images, a driving element which drives the display element, and wiring lines which transmit various signals to the display element and the driving element.

The display element can be defined in different manners depending on the type of the display panel 120. For example, when the display panel 120 is an organic light emitting display panel 120, the display element can be an organic light emitting diode which includes an anode, an organic emission layer, and a cathode. For example, when the display panel 120 is a liquid crystal display panel, the display element can be a liquid crystal display element. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device 100, the display panel 120 can be implemented as a flexible display panel 120 to be wound around or unwound from the outer roller 161.

The display panel 120 includes an active area AA and a non-active area NA.

The active area AA is an area where images are displayed in the display panel 120. In the active area AA, a plurality of sub pixels which configures the plurality of pixels and a driving circuit for driving the plurality of sub pixels can be disposed. The plurality of sub pixels is minimum units which configure the active area AA and a display element can be disposed in each of the plurality of sub pixels. For example, an organic light emitting diode which includes an anode, an organic emission layer, and a cathode can be disposed in each of the plurality of sub pixels, but it is not limited thereto. Further, a driving circuit for driving the plurality of sub pixels can include a driving element and a wiring line. For example, the driving circuit can be configured by a thin film transistor, a storage capacitor, a gate line, and a data line, but is not limited thereto.

The non-active area NA is an area where no image is displayed. In the non-active area NA, various wiring lines and circuits for driving the organic light emitting diode of the active area AA are disposed. For example, in the non-active area NA, a link line which transmits signals to the plurality of sub pixels and driving circuits of the active area AA or a driving IC such as a gate driver IC or a data driver IC can be disposed, but the non-active area is not limited thereto.

In the meantime, the non-active area NA includes a pad area and a gate driving area, but can include other areas such as a data driving area.

The pad area is an area in which a plurality of pads is disposed. The plurality of pads are electrodes which electrically connect the plurality of flexible films 130 and the display panel 120 so that the plurality of flexible films 130 and the display panel 120 can be electrically connected through the plurality of pads. The pad area can be a non-active area NA which overlaps the second support area PA2 of the first cover 110*a* in the non-active area NA. However, the pad area can also be formed in the other part of the non-active area NA depending on the arrangement of the plurality of flexible films 130, but is not limited thereto.

The gate driving area is an area where a gate driver is disposed. The gate driving area can be a non-active area NA at a left side and a right side of the active area AA. The gate driver outputs a gate voltage and an emission control voltage under the control of the timing controller to select a sub pixel in which a data voltage is charged through a wiring line, such as a gate line or an emission control signal line and can adjust an emission timing. Hereinafter, it is assumed that the gate driver is formed directly on the substrate 121 by a gate-driver in panel (GIP) method, but is not limited thereto. In this case, the gate driving area where the gate driver is disposed can also be referred to as a GIP area.

Referring to FIG. 5, the display panel 120 includes a substrate 121, a buffer layer 122, a pixel unit 123, an encapsulation layer 124, and an encapsulation substrate 125.

The substrate 121 is a base member which supports various components of the display panel 120 and can be configured by an insulating material (e.g., can comprise an insulating material). The substrate 121 can be formed of a material having a flexibility (e.g., can elastically deform) to allow the display panel 120 to be wound or unwound. For example, the substrate 121 can be formed of a plastic material such as polyimide (PI).

The buffer layer 122 is disposed on (e.g., directly on) a top surface of the substrate 121. The buffer layer 122 can suppress moisture and/or oxygen from penetrating from outside of the substrate 121 and from being spread. The buffer layer 122 can be formed of an inorganic material, for example, can be configured by (e.g. can comprise) a single layer or a double layer of silicon oxide (Siox) and silicon nitride (SiNx), but is not limited thereto.

The pixel unit 123 is disposed on top surfaces of the substrate 121 and the buffer layer 122 and directly on the buffer layer 122. The pixel unit 123 includes a plurality of organic light emitting diodes and a circuit for driving the organic light emitting diode. The pixel unit 123 can be disposed so as to correspond to the active area AA.

In the meantime, the display panel 120 can be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer can be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode can be formed only of a transparent conductive material and the cathode can be formed of the metal material having a high reflectance to allow the light emitted from the organic light emitting diode to travel to the lower portion of the substrate 121.

Hereinafter, for the convenience of description, the description will be made by assuming that the display device 100 according to an exemplary embodiment of the present disclosure is a bottom emission type display device, but it is not limited thereto.

The encapsulation layer 124 is disposed to cover the pixel unit 123, and can cover all the outer surfaces of the pixel unit 123. The encapsulation layer 124 seals the organic light emitting diode of the pixel unit 123. The encapsulation layer 124 can protect the organic light emitting diode of the pixel unit 123 from external moisture, oxygen, and impact. The encapsulation layer 124 can be formed by alternately laminating a plurality of inorganic layers and a plurality of organic layers. For example, the inorganic layer can be formed of an inorganic material, such as silicon nitride (SiNx), silicon oxide (Siox), and aluminum oxide (AlOx), or a combination thereof, and the organic layer can be formed of an epoxy or acrylic polymer, but they are not limited thereto.

The encapsulation substrate 125 is disposed on (e.g., directly on) the encapsulation layer 124. Specifically, the encapsulation substrate 125 is disposed between (e.g., directly between) the encapsulation layer 124 and the first cover 110*a*. The encapsulation substrate 125 can protect the organic light emitting diode of the pixel unit 123 together with the encapsulation layer 124. The encapsulation substrate 125 can protect the organic light emitting diode of the pixel unit 123 from external moisture, oxygen, and impact. For example, the encapsulation substrate 125 can be formed of a material having high modulus of approximately 200 to 900 MPa. The encapsulation substrate 125 can be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate 125 is formed of a metal material, the encapsulation substrate 125 can be implemented as an ultra-thin film and provide a strong resistance against external impacts and scratches.

An adhesive layer AD is disposed between the encapsulation layer 124 and the encapsulation substrate 125. The adhesive layer AD can bond the encapsulation layer 124 and the encapsulation substrate 125. The adhesive layer AD is formed of a material having an adhesiveness and can be a thermosetting or natural curable type adhesive. For example, the adhesive layer AD can be formed of an optical clear adhesive (OCA) or a pressure sensitive adhesive (PSA), but is not limited thereto.

In the meantime, the adhesive layer AD can be disposed to enclose the encapsulation layer 124 and the pixel unit 123. That is, the pixel unit 123 can be sealed by the buffer layer 122 and the encapsulation layer 124, and the encapsulation layer 124 and the pixel unit 123 can be sealed by the buffer layer 122 and the adhesive layer AD. The adhesive layer AD can protect the organic light emitting diode of the pixel unit 123 from external moisture, oxygen, and impact together with the encapsulation layer 124 and the encapsulation substrate 125. In this case, the adhesive layer AD can further include a moisture absorbent. The moisture absorbent can be particles having hygroscopicity and absorb moisture and oxygen from the outside to minimize permeation of the moisture and oxygen into the pixel unit 123.

Referring to FIG. 5, an adhesive unit 190 which bonds the display panel 120 and the first cover 110*a* is disposed. The adhesive unit 190 is disposed between the display panel 120 and the first cover 110*a* to bond the display panel 120 and the first cover 110*a*. The adhesive unit 190 can bond the display panel 120 and the first cover 110*a* in a manner of bonding the encapsulation substrate 125 and the first cover 110*a*. The adhesive unit 190 can be disposed between the encapsulation substrate 125 and the first cover 110*a* and can bond the encapsulation substrate 125 and the first cover 110*a*.

A polarizer can be disposed on a rear surface of the display panel 120. The polarizer selectively transmits light to reduce the reflection of external light which is incident onto the display panel 120. Specifically, the display panel 120 includes various metal materials applied to the semiconductor element, the wiring line, and the organic light emitting diode. Therefore, the external light incident onto the display panel 120 can be reflected from the metal material so that the visibility of the display device 100 can be reduced due to the reflection of the external light. However, when the polarizer is disposed, the polarizer suppresses the reflection of the external light to increase the outdoor visibility of the display device 100. However, the polarizer can be omitted depending on an implementation example of the display device 100.

Referring to FIG. 4B, a plurality of flexible films 130 are disposed at one end of the display panel 120. The plurality of flexible films 130 is films in which various components are disposed on a base film having a softness to supply a signal to the plurality of sub pixels which configures the plurality of pixels of the active area AA and the driving circuits and can be electrically connected to the display panel 120. One ends of the plurality of flexible films 130 are disposed in the non-active area NA of the display panel 120 to supply a power voltage or a data voltage to the plurality of sub pixels and the driving circuits of the active area AA. In the meantime, even though eight flexible films 130 are illustrated in FIG. 4B, the number of flexible films 130 can vary depending on the design, but is not limited thereto. For example, there can be any number of flexible films 130, such as ten, twenty, thirty, etc.

A driving IC such as a gate driver integrated circuit (IC) or a data driver IC can be disposed on the base film of the plurality of flexible films 130. The driving IC is a component which processes data for displaying images and a driving signal for processing the image. The driving IC can be disposed by a chip on glass (COG), a chip on film (COF), or a tape carrier package (TCP) depending on a mounting method. However, for the convenience of description, in FIG. 4B, it is illustrated that the driving IC is mounted on the plurality of flexible films 130 by a chip on film technique, but is not limited thereto.

In the meantime, the plurality of flexible films 130 is components in which a base film and various driving ICs which control data for displaying images on the base film are disposed, therefore, the flexible film is a component to display images. The plurality of flexible films 130 is electrically connected to the pad area at one end of the display panel 120 to be bent toward a rear surface of the first cover 110*a*. One ends of the plurality of flexible films 130 are connected to one end of the display panel 120 on one surface of the first cover 110*a* and the other ends of the plurality of flexible films 130 can be disposed at an opposite surface of the one surface of the first cover 110*a*, but is not limited thereto.

Referring to FIG. 4B, the first printed circuit board 140 is disposed on the rear surface of the first cover 110*a* to be connected to the plurality of flexible films 130. That is, the first printed circuit board 140 is disposed on the rear surface of the first cover 110*a* to be electrically connected to the plurality of flexible films 130. The first printed circuit board 140 is a component which supplies signals to the driving IC of the plurality of flexible films 130. Various components can be disposed in the first printed circuit board 140 to supply various signals, such as a driving signal or a data signal to the driving IC. In the meantime, even though two first printed circuit boards 140 are illustrated in FIG. 4B, the number of first printed circuit boards 140 can vary depending on the design and is not limited thereto.

Further, a second printed circuit board which is connected to the first printed circuit board 140 can be further disposed. At this time, the first printed circuit board 140 can be referred to as a source printed circuit board S-PCB on which the data driver is mounted and the second printed circuit board connected to the first printed circuit board 140 can be referred to as a control printed circuit board C-PCB on which a timing controller is mounted. The second printed circuit board will be described below with reference to FIG. 6C.

Hereinafter, an outer roller 161 and an inner roller 163 will be described in more detail with reference to FIGS. 6A to 6C.

<Outer Roller and Inner Roller>

Figure 6A:
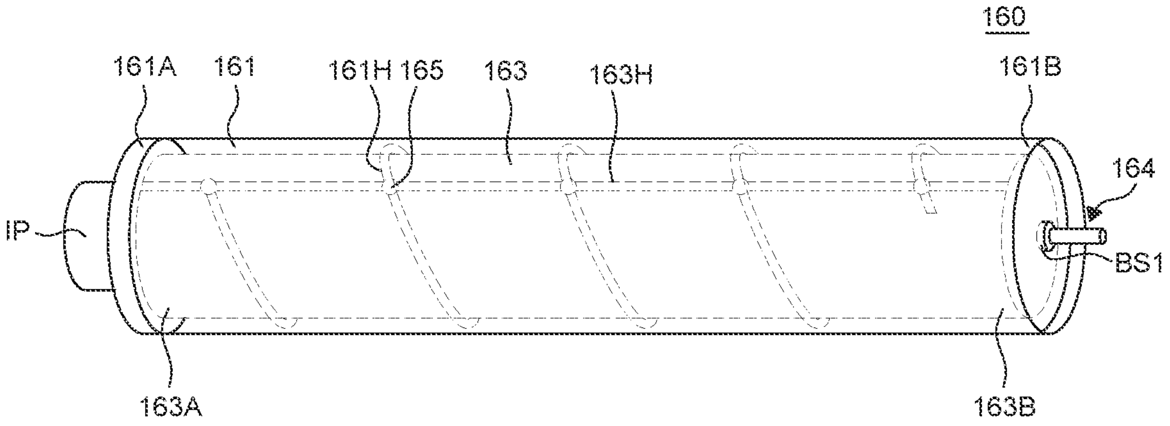
FIGS. 6A to 6C are views for explaining an inner roller and an outer roller of a display device according to an exemplary embodiment of the present disclosure.
Figure 6B:
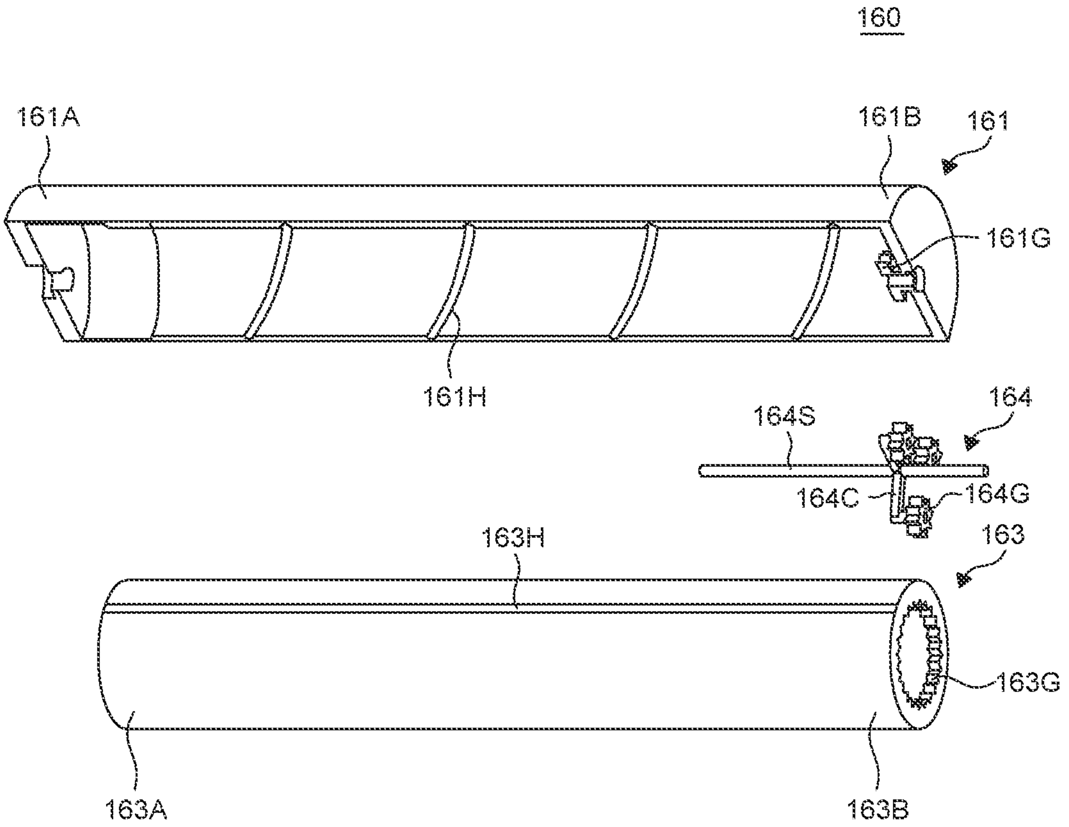
Figure 6C:
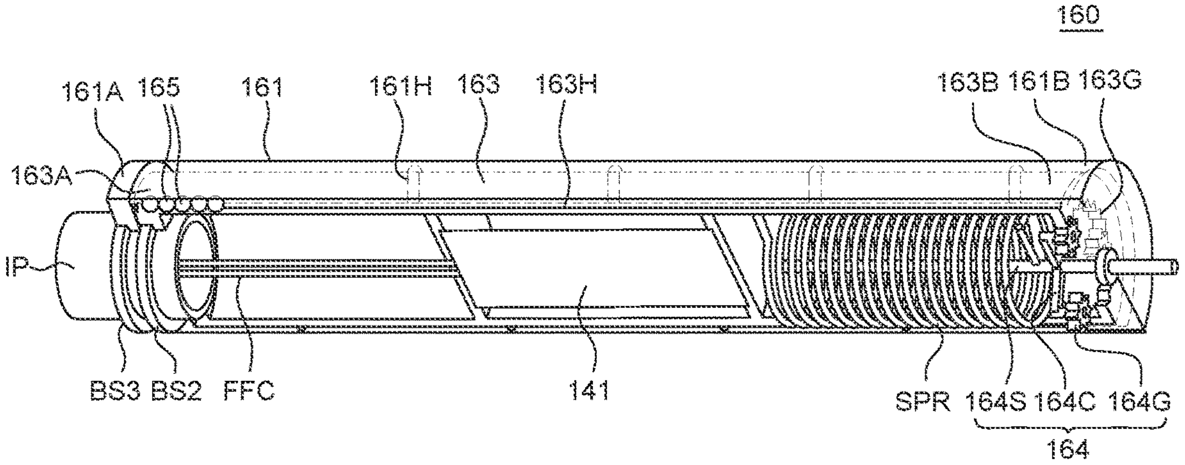

FIGS. 6A to 6C are views for explaining an inner roller and an outer roller of a display device according to an exemplary embodiment of the present disclosure. In FIG. 6C, for the convenience of description, the inside of the outer roller 161 is illustrated in perspective so that insides of the outer roller 161 and the inner roller 163 are visible.

Referring to FIGS. 6A to 6C, in the roller unit 160 of the display device 100 according to the exemplary embodiment of the present disclosure, the outer roller 161, the inner roller 163, a roller connection unit 164, a conductive ball 165, a second printed circuit board 141, a cable FFC, and a spring SPR are disposed.

The outer roller 161 is configured to wind or unwind the display unit DP. The outer roller 161 is configured to accommodate other components in an inner space of the outer roller 161.

A spiral groove 161H is disposed on an inner circumferential surface of the outer roller 161. The spiral groove 161H can be formed by forming a spiral groove along an inner circumferential surface of the outer roller 161 and can extend from one end (e.g., a first end) 161A of the outer roller 161 to the other end (e.g., a second end) 161B of the outer roller 161.

An outer roller gear 161G is disposed at the other end 161B of the outer roller 161. Specifically, the outer roller gear 161G is fixedly disposed to the inner surface of the other end 161B of the outer roller 161. The outer roller gear 161G can be configured to rotate together with the outer roller 161 when the outer roller 161 rotates.

The inner roller 163 is accommodated in (e.g., fully accommodated in) the outer roller 161. Specifically, the inner roller 163 can be accommodated in an inner space of the outer roller 161.

A straight groove 163H is disposed on an outer circumferential surface of the inner roller 163. The straight groove 163H extends from one end (e.g., a first lateral end) 163A of the inner roller 163 to the other end (e.g., a second lateral end) 163B of the inner roller 163 on the outer circumferential surface of the inner roller 163. The straight groove 163H extends in the same direction as a rotation axis of the inner roller.

An inner roller gear 163G is disposed in the inner roller 163. The inner roller gear 163G can be formed by passing through the other end 163B of the inner roller 163. The inner roller gear 163G can extend an entire length of the inner roller 163.

In the meantime, the inner roller gear 163G can be disposed on the same plane as the outer roller gear 161G and each of the inner roller gear 163G and the outer roller gear 161 can be configured to interwork (e.g., mesh) with a connection gear 164G to be described below, which will be described below with reference to FIGS. 7A and 7B.

The inner roller 163 is configured to accommodate other components in an inner space.

The second printed circuit board 141 is disposed in the inner roller 163 (e.g., within an interior space of the inner roller 163). The second printed circuit board 141 can be accommodated in the inner space of the inner roller 163 and can be fixed to the inner space of the inner roller 163. The second printed circuit board 141 is a control printed circuit board (control PCB, C-PCB) in which a timing controller is mounted and is connected to the first printed circuit board 140 to be electrically connected to the display panel 120.

A plurality of cables FFC are disposed in the inner roller 163. The plurality of cables FFC are connected to the second printed circuit board 141 and can apply a power or a signal from the outside to the second printed circuit board 141.

Referring to FIG. 6B, the plurality of cables FFC can extend to the outside by means of openings at one ends 161A and 163A of the outer roller 161 and the inner roller 163.

An insulating pipe IP is disposed in the openings of the one ends 161A and 163A of the outer roller 161 and the inner roller 163. For example, the insulating pipe IP can be formed of an insulating material. Therefore, the insulating pipe IP can be configured to insulate the outer roller 161 and the inner roller 163 from the plurality of cables FFC.

Referring to FIG. 6C, a second bushing BS2 is disposed between the inner roller 163 and the insulating pipe IP and a third bushing BS3 is disposed between the outer roller 161 and the insulating pipe IP. The second bushing BS2 and the third bushing BS3 minimize the wearing of the outer roller 161 and the inner roller 163 and the insulating pipe IP due to the rotation when the display unit DP is wound or unwound to protect the outer roller 161 and the inner roller 163 and the insulating pipe IP. The term “bushing” used in the specification can refer to a bearing, as known in the art.

A spring SPR is disposed in the inner roller 163. Specifically, the spring SPR is disposed at the other end of the inner roller 163 in which the plurality of cables FFC is not disposed.

Referring to FIG. 6C, one end of the spring SPR is connected to the inner surface of the inner roller 163 and the other end of the spring SPR is connected to a shaft 164S of the roller connection unit 164 to be described below. Therefore, the spring SPR can be configured to constantly maintain a tension which is applied to the display panel 120 when the inner roller 163 rotates. This constant tension caused by the spring SPR allows for controlled (e.g., smooth) rolling and unrolling of the display panel 120.

The roller connection unit 164 is disposed between the outer roller 161 and the inner roller 163. The roller connection unit 164 interlinks the rotations of the outer roller 161 and the inner roller 163. Therefore, the outer roller 161 and the inner roller 163 can be configured to rotate in the same direction.

The roller connection unit 164 includes a shaft 164S, a plurality of connection gears 164G, and a connection unit 164C.

The shaft 164S is disposed in a rotation axis of the outer roller 161. The shaft 164S is disposed to pass through the other end 163B of the inner roller 163 and the other end 161B of the outer roller 161 which is adjacent to the other end 163B of the inner roller 163.

The plurality of connection gears 164G is disposed so as to enclose the shaft 164S. The plurality of connection gears 164G interlinks (e.g., mesh) the rotations of the outer roller gear 161G and the inner roller gear 163G between the outer roller gear 161G and the inner roller gear 163G.

The connection unit 164C is disposed to extend from the shaft 164S to the rotation axis of the plurality of connection gears 164G. The connection unit 164C is configured to connect the shaft 164S and the plurality of connection gears 164G. Therefore, the plurality of connection gears 164G can be configured to rotate in accordance with the rotation of the shaft 164S.

Referring to FIGS. 6A and 6B, a first bushing BS1 is disposed between the shaft 164S and the outer roller 161. Specifically, the first bushing BS1 is disposed between the other end 161A of the outer roller 161 through which the shaft 164S passes and the shaft 164S. The first bushing BS1 is a configuration which protects the shaft 164S and the outer roller 161 from being worn and is disposed to minimize the damage of the shaft 164S and the outer roller 161 caused by the rotational operation of the shaft 164S or the outer roller 161.

A plurality of conductive balls 165 is disposed between the outer roller 161 and the inner roller 163. The plurality of conductive balls 165 is disposed on the straight groove 163H of the inner roller 163 and can be guided by the spiral groove 161H of the outer roller 161. Therefore, the plurality of conductive balls 165 can be configured to move along the spiral groove 161H when the display unit DP is wound or unwound. The plurality of conductive balls can be in the form of ball bearings.

The plurality of conductive balls 165 can provide a contact of the outer roller 161 and the inner roller 163 between the outer roller 161 and the inner roller 163, so that the outer roller 161 can rotate with respect to the inner roller 163, so as not to interrupt the rotation of the outer roller 161 and the inner roller 163. However, the movement of the plurality of conductive balls 165 when the display unit DP is wound or unwound will be described below in more detail with reference to FIGS. 9A and 9B. In the meantime, in FIGS. 6A and 6B, it is illustrated that five conductive balls 165 are disposed, but the number of the plurality of conductive balls 165 is not limited thereto.

Hereinafter, the outer roller gear 161G, the inner roller gear 163G, and the connection gear 164G will be described in more detail with reference to FIGS. 7A and 7B together.

<Outer Roller Gear, Inner Roller Gear, and Intermediate Gear>

Figure 7A:
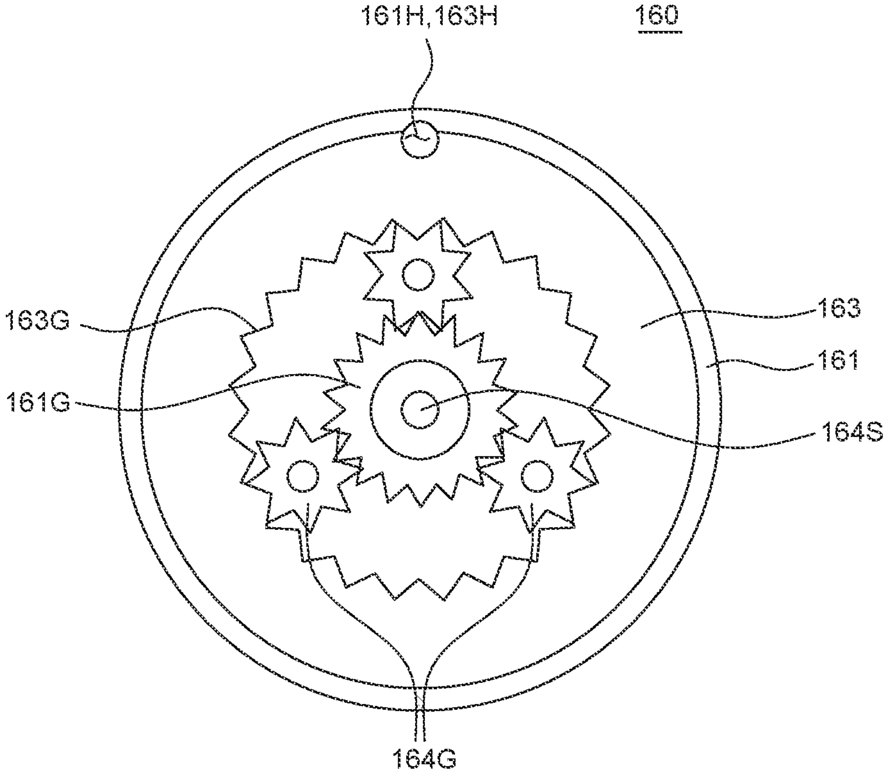
FIGS. 7A and 7B are views for explaining the coupling of an outer roller gear, an inner roller gear, and a connection gear of a display device according to an exemplary embodiment of the present disclosure.
Figure 7B:
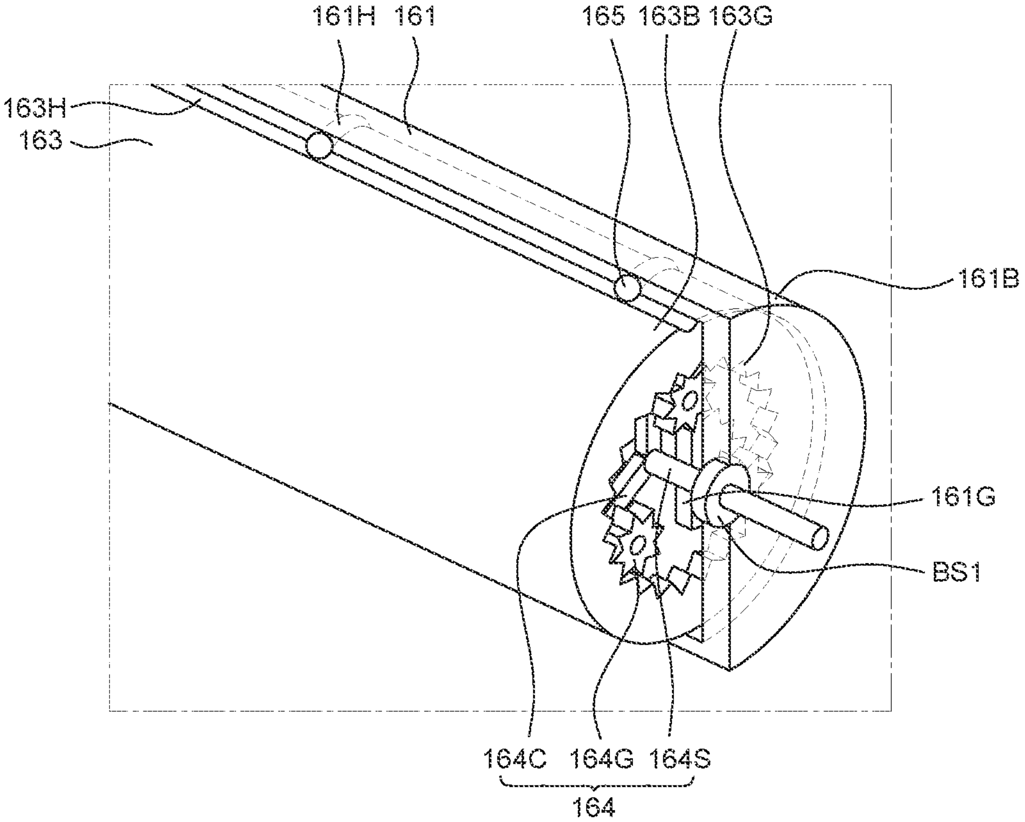

FIGS. 7A and 7B are views for explaining the coupling of an outer roller gear, an inner roller gear, and a connection gear of a display device according to an exemplary embodiment of the present disclosure. In FIG. 7A, a cross section of a position in which the outer roller gear 161G, the inner roller gear 163G, and a plurality of connection gears 164G are coupled in the roller unit 160 is illustrated. In FIG. 7B, for the convenience of description, a part of the outer roller 161 and a part of the outer roller gear 161G are omitted.

Referring to FIGS. 7A and 7B, the outer roller gear 161G, the inner roller gear 163G, and the plurality of connection gears 164G are disposed on the same plane. The plurality of connection gears 164G is disposed so as to enclose the outer roller gear 161G and is disposed so as to move in a space formed by the inner roller gear 163G. That is, the plurality of connection gears 164G mesh between the inner roller gear 163G and the outer roller gear 161G.

The outer roller gear 161G and the inner roller gear 163G are configured to rotate in the same direction by the plurality of connection gears 164G. Therefore, the outer roller 161 and the inner roller 163 in which the outer roller gear 161G and the inner roller gear 163G are disposed are configured to rotate in the same direction.

Specifically, when the display unit DP is wound or unwound, the outer roller 161, which is connected to the display unit DP, rotates and the outer roller gear 161G disposed in the outer roller 161 rotates. Next, the plurality of connection gears 164G connected to the outer roller gear 161G rotates in an opposite direction to the outer roller gear 161G by the rotation of the outer roller gear 161G. Further, the inner roller 163 rotates in the same direction as the outer roller 161 by the inner roller gear 163G disposed so as to enclose the plurality of connection gears 164G.

In the meantime, the outer roller 161 is configured to rotate faster than the inner roller 163 by the interworking of the outer roller gear 161G, the inner roller gear 163G, and the plurality of connection gears 164G. Therefore, the spiral groove 161H of the outer roller 161 can be configured to guide the plurality of conductive balls 165.

For example, referring to FIG. 7A, teeth of the outer roller gear 161G can be more densely disposed than teeth of the inner roller gear 163G, and thus, the outer roller 161 can rotate faster than the inner roller 163. That is, the outer roller gear 161G can include more teeth than the inner roller gear 163G.

Hereinafter, an elastic member 163E will be described in more detail with reference to FIGS. 8A and 8B.

<Elastic Member>

Figure 8A:
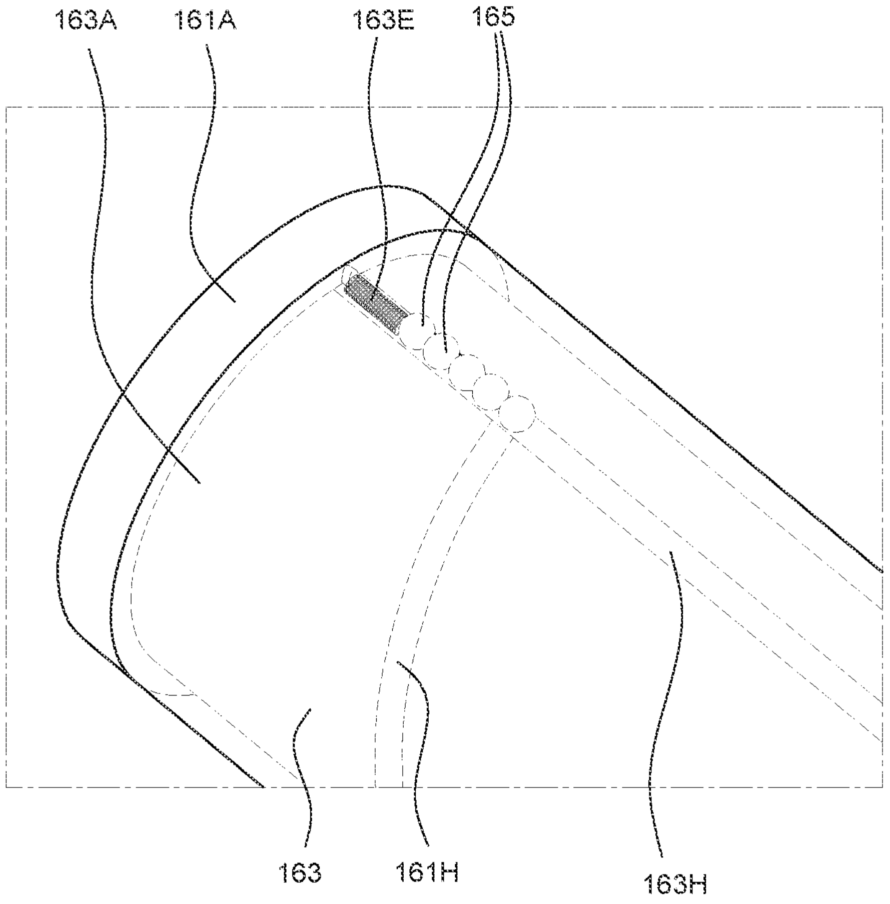
FIGS. 8A and 8B are views for explaining an elastic member of a display device according to an exemplary embodiment of the present disclosure.
Figure 8B:
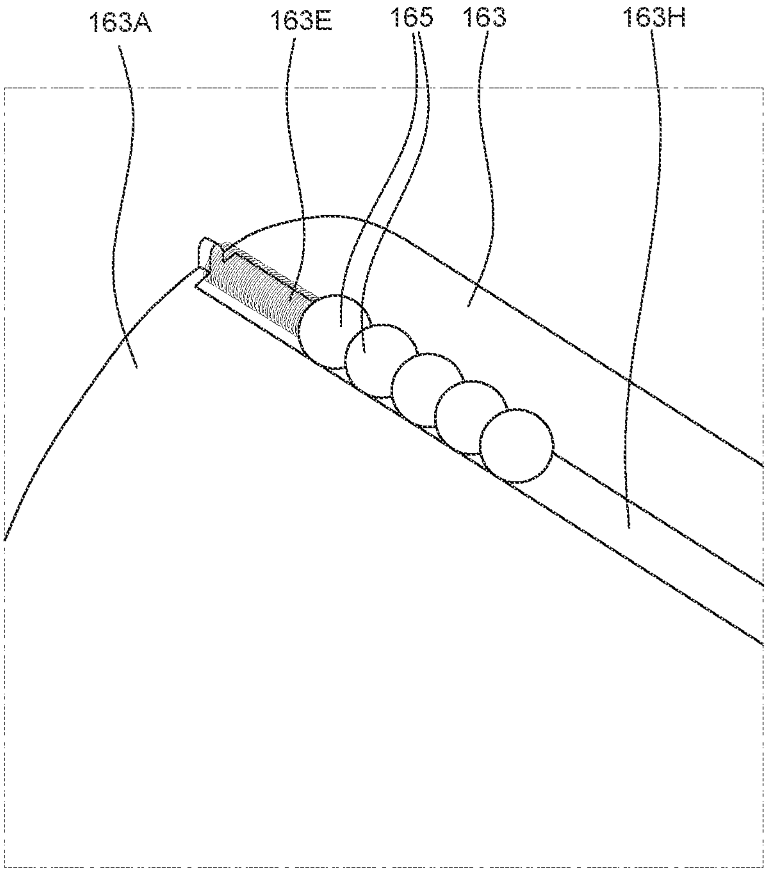

FIGS. 8A and 8B are views for explaining an elastic member of a display device according to an exemplary embodiment of the present disclosure. Particularly, FIG. 8A illustrates a position in which an elastic member 163E is disposed between the outer roller 161 and the inner roller 163 and FIG. 8B illustrates a position in which the elastic member 163E is disposed on the inner roller 163.

Referring to FIGS. 8A and 8B, the elastic member 163E is disposed at one end 163A of the inner roller 163. Specifically, the elastic member 163E is disposed at one end of the straight groove 163H of the inner roller 163. The elastic member 163E transmits an elastic force to the plurality of conductive balls 165 and can move the plurality of conductive balls 165 to the other end of the straight groove 163H. That is, the elastic member 163E can be configured to transmit the elastic force which moves the plurality of conductive balls 165 to the other end (e.g., an opposite end) of the straight groove 163H.

In the meantime, in FIGS. 8A and 8B, the elastic member 163E is a spring (e.g., a coil spring, etc. However, the elastic member 163E can also be disposed with another shape and/or material which transmits the elastic force to the plurality of conductive balls 165, but is not limited thereto.

Hereinafter, the movement of the plurality of conductive balls 165 will be described in more detail with reference to FIGS. 9A and 9B together.

<Movement of Plurality of Conductive Balls>

Figure 9A:
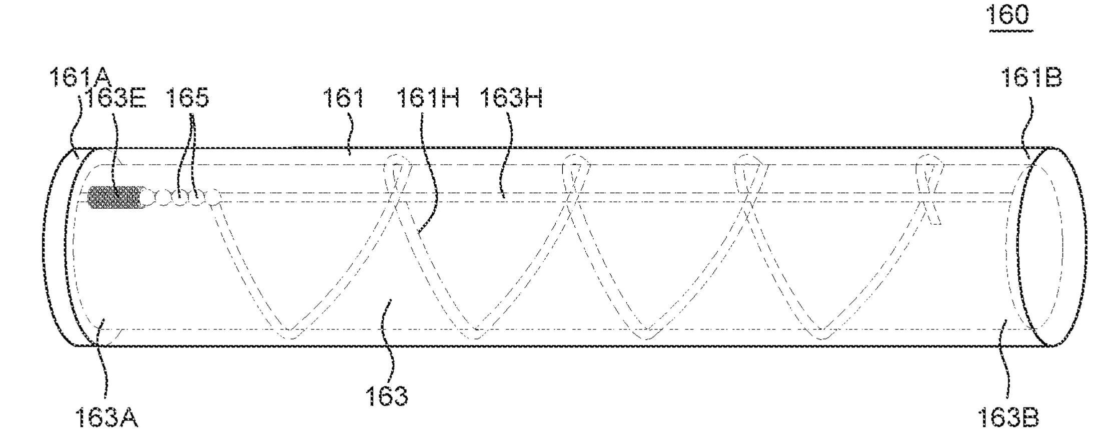
FIGS. 9A and 9B are views for explaining movement of a conductive ball of a display device according to an exemplary embodiment of the present disclosure.
Figure 9B:
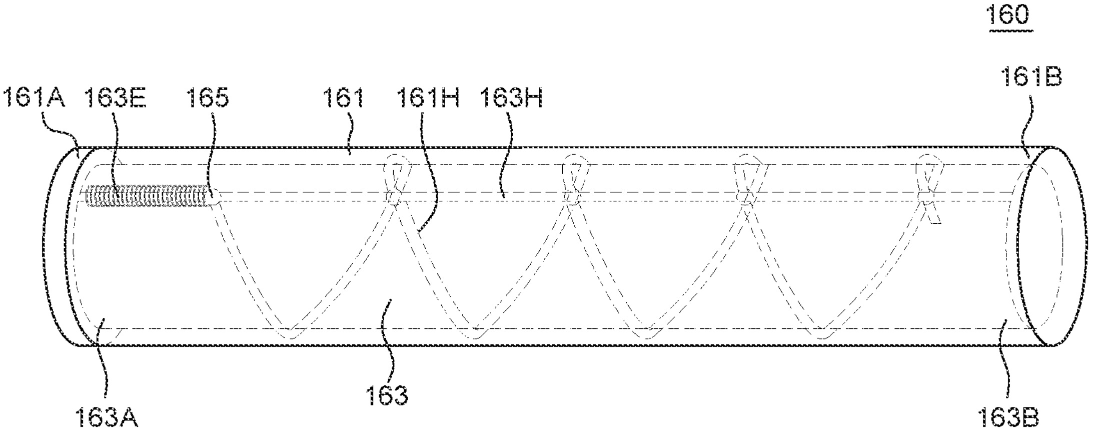

FIGS. 9A and 9B are views for explaining movement of a conductive ball of a display device according to an exemplary embodiment of the present disclosure. Particularly, FIG. 9A illustrates a shape in which a plurality of conductive balls is disposed when the display unit DP is fully wound and FIG. 9B illustrates a shape in which a plurality of conductive balls is disposed when the display unit DP is fully unwound. In FIGS. 9A and 9B, for the convenience of description, among various components of the outer roller 161, only the spiral groove 161H is illustrated and among various components of the inner roller 163, a straight groove 163H and an elastic member 163E are illustrated.

Referring to FIGS. 9A and 9B, the plurality of conductive balls 165 is disposed on the straight groove 163H of the inner roller 163 and can be guided by the spiral groove 161H of the outer roller 161. Therefore, the plurality of conductive balls 165 is guided by the spiral groove 161H when the display unit DP is wound or unwound to move from one end of the inner roller 163 to the other end 163B of the inner roller 163 along the straight groove 163H of the inner roller 163.

Referring to FIG. 9A, when the display unit DP is fully wound, the plurality of conductive balls 165 is disposed at one end of the straight groove 163H. When the display unit DP is fully wound, the plurality of conductive balls 165 can receive an elastic force, which move to the other end of the straight groove 163H, that is, to the other end 163B of the inner roller 163, by the elastic member 163E. Further, the plurality of conductive balls 165 can be configured to be blocked by the outer roller 161 so as not to move to a portion in which the spiral groove 161H is not disposed. That is, when the display device 100 is not driven but the display unit DP is fully wound, the plurality of conductive balls 165 is not spread, but can be disposed at one end of the straight groove 163H, as shown in FIGS. 8B and 9A.

Referring to FIG. 9B, when the display unit DP is fully unwound, the plurality of conductive balls 165 is disposed at each intersection of the straight groove 163H and the spiral groove 161H. When the display unit DP is fully unwound, the plurality of conductive balls 165 is disposed in the straight groove 163H with a constant interval. When the display unit DP is unwound, the plurality of conductive balls 165 are guided along the spiral groove 161H on the straight groove 163H and can be disposed in the straight groove 163H with a constant interval in accordance with an interval of the spiral groove 161H. Therefore, the plurality of conductive balls 165 can be configured to be disposed in a position determined between the inner roller 163 and the outer roller 161 which rotate. That is, when the display device 100 is driven to fully unwound the display unit DP in which the image is displayed, the plurality of conductive balls 165 can be disposed with a constant interval (e.g., constant spacing).

In the display device according to the exemplary embodiment of the present disclosure, the plurality of conductive balls 165 are disposed between the inner roller 163 and the outer roller 161 of the roller unit 160 to control a resonance length of the roller unit 160, thereby improving the electromagnetic interference noise.

Specifically, in the display device, the roller unit is configured to wind or unwind so that the roller unit is configured by a fixed tool whose length is not variable. At this time, the roller unit has a unique resonance frequency. In addition, the electromagnetic wave of the high frequency which is generated by the printed circuit board inserted into the roller unit and the roller unit resonate so that the electromagnetic interference noise (EMI) can be caused. In this time, in order to avoid resonance of the electromagnetic wave generated in the printed circuit board and the roller unit, it can be requested to control the length of the roller unit to control the resonance frequency of the roller unit. However, the roller unit is a fixed tool disposed with a predetermined length so that it can be difficult to arbitrarily change the length of the roller unit, that is, the resonance length of the roller unit.

Thus, in the display device according to the exemplary embodiment of the present disclosure, the plurality of conductive balls 165 are disposed between the inner roller 163 and the outer roller 161 of the roller unit 160. Further, the plurality of conductive balls 165 are guided along the spiral groove 161H of the outer roller 161 in the straight groove 163H of the inner roller 163 and can be disposed in a predetermined position between the inner roller 163 and the outer roller 161 which rotate.

Therefore, the plurality of conductive balls 165 can be configured to provide a contact of the outer roller 161 and the inner roller 163 and control the resonance length of the roller unit 160, which is a fixed tool. Specifically, potentials at points in which the plurality of conductive balls 165 is in contact with the outer roller 161 and the inner roller 163 are all equipotential so that the resonance length of the roller unit 160 can be an interval between the plurality of conductive balls 165. The interval between the plurality of conductive balls 165 can be shorter than a length of the roller unit 160 itself.

Accordingly, the resonance frequency of the roller unit 160 can be reduced in proportional to an interval between the plurality of conductive balls 165. Further, the resonance length of the roller unit 160 can be configured to avoid the electromagnetic wave, which is a relatively high frequency, generated by the second printed circuit board 141 inserted into the roller unit 160. Furthermore, the roller unit 160 can be configured so as not to resonate with the electromagnetic wave generated by the second printed circuit board 141 to minimize the generation of the electromagnetic interference noise (EMI). Therefore, in the display device according to the exemplary embodiment of the present disclosure, the plurality of conductive balls 165 is disposed between the inner roller 163 and the outer roller 161 of the roller unit 160 to reduce a resonance length of the roller unit 160, thereby improving the electromagnetic interference noise.

The exemplary embodiments of the present disclosure can also be described as follows:

According to an aspect of the present disclosure, a display device includes a display unit which includes a display panel and a back cover supporting a rear surface of the display panel, an outer roller which is configured to wind or unwind the display unit and has a spiral groove disposed on an inner circumferential surface, an inner roller which is accommodated in the outer roller and has a straight groove disposed on an outer circumferential surface, a plurality of conductive balls which is disposed between the outer roller and the inner roller and configured to move along the spiral groove when the display unit is wound or unwound, and a roller connection unit which interlinks rotations of the outer roller and the inner roller.

When the display unit is fully wound, the plurality of conductive balls can be disposed at one end of the straight groove and when the display unit is fully unwound, the plurality of conductive balls can be disposed at intersections of the straight groove and the spiral groove.

When the display unit is fully unwound, the plurality of conductive balls can be disposed in the straight groove with a constant interval.

The straight groove can extend in the same direction as a rotation axis of the inner roller.

The outer roller can include an outer roller gear which is configured to interwork with the roller connection unit and the inner roller includes an inner roller gear which is configured to interwork with the roller connection unit.

The roller connection unit can include a shaft which is disposed in a rotation axis of the outer roller and passes through the other end of the inner roller and the other end of the outer roller adjacent to the other end of the inner roller, a plurality of connection gears which interlinks the rotations of the outer roller gear and the inner roller gear between the outer roller gear and the inner roller gear, and a connection unit which extends from the shaft to a rotation axis of the plurality of connection gears.

The outer roller gear can be disposed in an inner surface of the other end of the outer roller and the inner roller gear can be formed so as to pass through the other end of the inner roller.

The display device can further comprise a spring disposed in the inner roller.

One end of the spring can be connected to an inner surface of the inner roller and the other end of the spring can be connected to the shaft.

The display device can further comprise a first bushing which is disposed between the other end of the outer roller through which the shaft passes and the shaft.

The outer roller can rotate faster than the inner roller by interworking of the outer roller gear, the inner roller gear, and the roller connection unit.

The outer roller and the inner roller can be configured to rotate in the same direction.

The inner roller can further include an elastic member which is disposed at one end of the straight groove to transmit an elastic force which moves the plurality of conductive balls to the other end of the straight groove.

The display device can further comprise a printed circuit board disposed in the inner roller, and a cable connected to the printed circuit board.

The cable can extend to the outside by means of openings of one end of the inner roller and one end of the outer roller.

The display device can further comprise an insulating pipe which is configured in the opening and insulates the inner roller and the outer roller from the cable.

The display device can further comprise a second bushing disposed between the inner roller and the insulating pipe, and a third bushing disposed between the outer roller and the insulating pipe.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a display unit including:
- a display panel; and
- a back cover supporting a rear surface of the display panel;

an outer roller configured to wind or unwind the display unit, the outer roller including an inner circumferential surface having a spiral groove;

an inner roller disposed in the outer roller, the inner roller including an outer circumferential surface having a straight groove;

a plurality of conductive balls disposed between the outer roller and the inner roller, the plurality of conductive balls being configured to move along the spiral groove when the display unit is wound or unwound; and a roller connection unit interlinking rotations of the outer roller and the inner roller.

2. The display device according to claim 1, wherein when the display unit is fully wound, the plurality of conductive balls are disposed at a first end of the straight groove and wherein when the display unit is fully unwound, the plurality of conductive balls are disposed at intersections of the straight groove and the spiral groove.

3. The display device according to claim 2, wherein when the display unit is fully unwound, the plurality of conductive balls are disposed in the straight groove with a constant interval.

4. The display device according to claim 1, wherein the straight groove extends in a same direction as a rotation axis of the inner roller.

5. The display device according to claim 1, wherein the outer roller includes an outer roller gear configured to mesh with the roller connection unit, and wherein the inner roller includes an inner roller gear configured to mesh with the roller connection unit.

6. The display device according to claim 5, wherein the roller connection unit includes:

a shaft disposed in a rotation axis of the outer roller, the shaft passing through a first end of the inner roller and a first end of the outer roller being adjacent to the first end of the inner roller;

a plurality of connection gears disposed between the outer roller gear and the inner roller gear, the plurality of connection gears being configured to mesh rotations of the outer roller gear and the inner roller gear; and a connection unit extending from the shaft to a rotation axis of each of the plurality of connection gears.

7. The display device according to claim 6, wherein the outer roller gear is disposed in an inner surface of the first end of the outer roller and wherein the inner roller gear passes through the first end of the inner roller.

8. The display device according to claim 6, further comprising:

a spring configured to maintain a tension applied to the display panel as the inner roller rotates, the spring including:

a first end connected to an inner surface of the inner roller; and a second end connected to the shaft.

9. The display device according to claim 6, further comprising:

a first bushing disposed between the first end of the outer roller and the shaft.

10. The display device according to claim 5, wherein the outer roller is configured to rotate faster than the inner roller by meshing of the outer roller gear, the inner roller gear, and the roller connection unit.

11. The display device according to claim 1, wherein the outer roller and the inner roller are configured to rotate in a same direction.

12. The display device according to claim 1, wherein the inner roller further includes an elastic member disposed at a first end of the straight groove, the elastic member being configured to transmit an elastic force to the plurality of conductive balls towards a second end of the straight groove.

13. The display device according to claim 1, further comprising:

a printed circuit board disposed in the inner roller; and a cable connected to the printed circuit board, wherein the cable extends to outside of the display device through an opening of the inner roller and an opening of the outer roller.

14. The display device according to claim 13, further comprising:

an insulating pipe disposed in the openings, the insulating pipe insulating the inner roller and the outer roller from the cable.

15. The display device according to claim 14, further comprising:

a second bushing disposed between the inner roller and the insulating pipe; and a third bushing disposed between the outer roller and the insulating pipe.

16. A display device, comprising:

a display configured to be wound and an unwound;

an outer roller configured to wind or unwind the display, the outer roller including a spiral groove disposed on an inner circumferential surface of the outer roller;

an inner roller disposed in the outer roller, the inner roller including an outer circumferential surface having a straight groove; and a plurality of ball bearings disposed between the outer roller and the inner roller, and configured to move along the spiral groove and the straight groove when the display is wound or unwound.

17. The display device of claim 16, further comprising a roller connection unit including a plurality of connection gears, wherein the outer roller includes an outer roller gear meshing with the plurality of connection gears, and wherein the inner roller includes an inner roller gear meshing with the plurality of connection gears.

18. The display device of claim 17, wherein the inner roller further includes an elastic member disposed at a first end of the straight groove, the elastic member being configured to transmit an elastic force to the plurality of ball bearings towards a second end of the straight groove.

19. The display device of claim 17, wherein the roller connection unit further includes:

a shaft connected to the plurality of connection gears; and a first bushing disposed between the outer roller and the shaft to allow the shaft to rotate relative to the outer roller.

20. The display device of claim 19, further comprising:

a spring including a first end connected to an inner surface of the inner roller and a second end connected to the shaft of the roller connection unit, the spring being configured to maintain a tension applied to the display as the inner roller rotates.

* * * * *